(12) United States Patent
Draxelmayr

(10) Patent No.: US 6,462,683 B2
(45) Date of Patent: Oct. 8, 2002

(54) CIRCUIT CONFIGURATION AND METHOD FOR SETTING THE SWITCHING POINTS OF A DECISION MAKER

(75) Inventor: Dieter Draxelmayr, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/822,031

(22) Filed: Mar. 29, 2001

(65) Prior Publication Data

US 2001/0043151 A1 Nov. 22, 2001

Related U.S. Application Data

(63) Continuation of application No. PCT/DE99/03118, filed on Sep. 28, 1999.

(30) Foreign Application Priority Data

Sep. 29, 1998 (DE) .......................... 198 44 663

(51) Int. Cl.⁷ .................................. H03M 1/06
(52) U.S. Cl. ........................... 341/118; 341/120
(58) Field of Search ...................... 341/118, 8, 11, 341/115, 111, 116, 101, 112; 356/373

(56) References Cited

U.S. PATENT DOCUMENTS

| | | | |
|---|---|---|---|
| 3,898,837 A | | 8/1975 | Boege |
| 4,318,617 A | * | 3/1982 | Orsen ........................ 356/373 |
| 5,677,686 A | * | 10/1997 | Kachi et al. .................. 341/8 |
| 6,215,426 B1 | * | 4/2001 | Taniguchi et al. ........... 341/115 |

FOREIGN PATENT DOCUMENTS

| | | |
|---|---|---|
| DE | 30 46 797 A1 | 9/1981 |
| EP | 0 479 176 B1 | 4/1992 |
| EP | 0 529 710 B1 | 3/1993 |
| GB | 2 206 254 A | 12/1988 |
| JP | 62-291 217 A | 12/1987 |
| JP | 06 058 772 | 3/1994 |
| WO | WO 92/08279 | 5/1992 |

OTHER PUBLICATIONS

Dr. R. Stumpe et al.: "A new generation of adaptive "Hall–Effect" based gear tooth sensors: Advantages of merged BIMos technology and new packaging concepts", VDI Berichte, No. 1287, 1996, 583–611.

Stumpe, R. et al.: "A new Generation of adaptive "HALL–Effect" based gear tooth sensor: Advantages of merged BIMos technology and new packaging concepts", VDI Berichte, vol. 1287, Sep. 12, 1996, pp. 583–611, XP–002072476.

* cited by examiner

Primary Examiner—Peguy Jeanpierre
Assistant Examiner—Joseph J Lauture
(74) Attorney, Agent, or Firm—Laurence A. Greenberg; Werner H. Stemer; Gregory L. Mayback

(57) ABSTRACT

A circuit configuration for calibrating the switching points of a decision module that is controlled by an analog input signal, in dependence on a direct component contained in the input signal in addition to an alternating component, is described. The circuit configuration contains a peak detector for detecting the upper and lower signal peaks of the input signal, a controllable reference unit for providing a reference value, an arithmetic unit for determining a mean value, and a comparison unit. In addition, the circuit configuration has a control unit for compensating the direct component of the input signal and a second control unit which is connected downstream of the comparison unit on the input side and is connected to the reference unit on the outputs side for inversely correcting the reference value.

19 Claims, 4 Drawing Sheets

CIRCUIT CONFIGURATION AND METHOD FOR SETTING THE SWITCHING POINTS OF A DECISION MAKER

CROSS-REFERENCE TO RELATED APPLICATION

This application is a continuation of copending International Application No. PCT/DE99/03118, filed Sep. 28, 1999, which designated the United States.

BACKGROUND OF THE INVENTION

Field of the Invention

The invention relates to a circuit configuration and a method for setting the switching points of a decision maker which is actuated by an analog input signal.

Sensors are used in a known manner to detect the movement or the position or orientation state of rotating parts. Examples of this include crankshaft, cam shaft, transmission and ABS sensors in automobiles. Hall sensors are preferably used as sensors and monitor a change in a magnetic field. To this end, for example, a permanent magnet is fitted to a stationary part, in order to produce a magnetic field. The magnetic field is then modulated by a gear wheel mounted on the rotating part or by some other ferromagnetic transmitter, depending on the position or orientation. The Hall sensor is in this case preferably located between the permanent magnet and the gear wheel or transmitter, and can thus detect fluctuations in the magnetic field. If, for example, a tooth of the gear wheel is located in the magnetic field, then a "high" output signal is supplied, while a gap between the teeth results in a "low" output signal. In this way, the signal emitted from the Hall sensor can be used to deduce the instantaneous orientation or position of a rotating part.

The signal supplied from a sensor is influenced substantially by the operating conditions in which the sensor is used. These operating conditions include unavoidable incalculable factors, such as the operating temperature or the size of the air gap etc. Despite the fluctuations caused by the operating conditions, the sensor should supply an output signal that is as well defined as possible. Therefore, the output signal should have a well-defined profile irrespective of fluctuations caused by the operating conditions. The reason for this is now described. If, for example, a sensor configuration supplies a sinusoidal signal, then a system controlled by the sensor configuration can maintain a well-defined response when the system switching processes, which depend on the output signal from the sensor, are carried out at the zero crossings of the signals. Specifically, the zero crossings are independent of the respective signal amplitude and, furthermore, have a high edge gradient.

If the output signal from the sensor has other signal forms, a switching point other than the zero crossing or signal mid-point may, of course, also be advantageous.

When evaluating the output signal of a sensor for switching a system which is controlled by this sensor, a switching point should therefore be maintained irrespective of the signal amplitude of the output signal from the sensor, and this applies even to very slow signals. In detail, VDI Reports 1287, 1996, pages 583 to 611, titled "Eine neue Generation von "Hall-Effekt"-Zahnradsensoren: Vorteile durch die Verbindung von BIMOS-Technologie und neuen Verpackungsrezepten" [A new Generation of "Hall Effect" Gearwheel Sensors: Advantages Resulting From the Use of BIMOS Technology and New Packaging Forms] describes a sensor configuration in which the amplitude of the output signal from the sensor is initially normalized, possibly with the aid of an analog/digital converter. The signal peak values are detected with the aid of two further analog/digital converters and digital/analog converters. This is used to derive and define a switching threshold. In the end, this allows a system response to be achieved which is essentially independent of temperature fluctuations and the width of the air gap. However, the complexity required for the sensor configuration is relatively high, since gain matching and numerous analog/digital converters are required.

SUMMARY OF THE INVENTION

It is accordingly an object of the invention to provide a circuit configuration and a method for setting the switching points of a decision maker which overcomes the above-mentioned disadvantages of the prior art devices and methods of this general type, which is actuated by an analog input signal, in which configuration and method switching processes can be set reliably and with high accuracy at selected points of an input signal, with little complexity.

With the foregoing and other objects in view there is provided, in accordance with the invention, a circuit configuration for correcting an analog input signal having a DC element, an AC element, and upper and lower signal peaks whose ratio to one another is fixed but variable. The analog input signal being corrected by compensation for the DC element. The circuit configuration contains a decision maker receiving the input signal and a calibration device. The calibration device includes an analog/digital converter actuated by the input signal and is connected to the decision maker. Peak-value detectors are provided for determining the upper and lower signal peaks of the input signal, the peak-value detectors are disposed downstream from the analog/digital converter. A controllable reference unit is provided for generating a reference value. A computation unit for determining a mean value from at least one signal minimum and at least one signal maximum is disposed downstream from the peak-value detectors. The mean value is either an arithmetic mean of the upper and lower signal peaks or mean weighted using the fixed but variable ratio. A comparison unit for determining a signal position of the input signal by comparing the reference value with the mean value determined by the computation unit is provided. The comparison unit is connected to the computation unit and to the controllable reference unit. A first regulating unit has an input connected to the comparison unit and an output linked to the decision maker. The first regulating unit compensates for the DC element in the input signal if an unbalanced signal position is detected by the comparison unit, with the compensation being carried out by subtraction of a value which is determined from an output of the comparison unit from the input signal. A second regulating unit has an input connected to the comparison unit and an output connected to the controllable reference unit. The second regulating unit readjusts the reference value in an opposite sense to an output signal from the comparison unit, in which case a difference between the mean value and the reference value is used to form a new reference value. A device for scaling the mean value is disposed between the computation unit and the comparison unit or an output side of the comparison unit.

The circuit configuration according to the invention for setting the switching points of a decision maker which is actuated by an analog input signal, independently of any DC element which is included in the input signal and together with upper and lower signal peaks, contains a control device having peak-value detectors. The peak-value detectors are actuated by the input signal, for determining the upper and lower signal peaks of the input signal. Furthermore, the control device has a controllable reference unit for providing a reference value, a computation unit connected downstream from the reference unit and the peak-value detectors for determining the mid-value from at least one upper and one lower signal peak, and a comparison unit for determining the signal position of the input signal by comparison of the reference value with the mid-value determined by the computation unit. Finally, a first regulating unit is provided whose input side is connected downstream from the comparison unit and whose output side is linked to the decision maker, in order to compensate for the DC element in the input signal by a compensation signal when a DC element is detected by the comparison unit.

A second regulating unit, whose input side is connected downstream from the comparison unit and whose output side is connected to the reference unit, is preferably also provided, for readjusting the reference value in the opposite sense.

The circuit configuration according to the invention allows the DC element contained in an analog input signal, independently of an AC element, to be determined with high accuracy and with relatively little complexity, and this is then used to set the switching threshold of the decision maker. It is particularly advantageous for the signal path on which the input signal is routed to contain virtually only the decision maker itself, so that the signal path is configured to be as simple as possible and thus does not itself cause any significant adverse effect on the input signal.

The control device preferably has circuitry for digital signal processing. In this case, an analog/digital converter is connected upstream of the control device, and a digital/analog converter is connected downstream from it. The digital signal processing offers high-precision signal processing with little complexity.

In one development of the invention, a controllable amplifier is connected upstream of the control device. The controlled input of the amplifier is in this case connected to a control output of the control device in order to control the gain of the amplifier as a function of the instantaneous value of the signal fed into the control device. The controllable amplifier in conjunction with the analog/digital converter results in an analog/digital converter with a logarithmic response, which allows very fine resolution in the region of the decision-maker switching point. It is thus even possible to use analog/digital converters that have only low resolution, but require only a low level of circuitry complexity. High accuracy can thus nevertheless be achieved with low circuitry complexity.

The amplifier gain preferably has binary steps and can be controlled by binary words. Binary stepping has the advantage that logarithmic gain changes can be achieved easily by shifting a binary number.

Finally, the control device may have a monitoring device for the decision maker and a timer. The output of the decision maker is connected to the control device and the control device monitors the output of the decision maker for signal changes, and initiates determination of the DC element if there is no signal change within a time governed by the timer. This prevents very slow changes in the DC element from not being detected by the configuration.

The invention also relates to a method for setting switching points for the decision maker. The decision maker is actuated by the analog input signal having a DC element which is contained in the input signal in addition to an AC element.

The method provides for determining an instantaneous signal profile of the input signal, preferably the time profile of the amplitude of the input signal. The lower and upper signal peaks in the signal profile are then determined. A mean value is calculated from at least one lower and upper signal peak. A discrepancy between the mean value and the predetermined reference value, which reflects the DC element, is calculated. The discrepancy is subtractively linked to the input signal. In this case, it is also possible to provide for the switching point to be set continuously, without specific external influences or signals initiating a setting process.

In a development of the invention, the instantaneous signal profile of the input signal is determined. At least the lower and upper signal peaks in the signal profile are determined. The mean value is calculated from the signal peaks and a discrepancy between the mean value and a predetermined reference value is calculated. The discrepancy is compared with a tolerance threshold value and, if the magnitude of the discrepancy exceeds the tolerance threshold value, it is subtractively linked to the input signal. Therefore, relatively small changes in the DC element are ignored, as a result of which, for example, relatively minor interference or noise has no influence on the setting of the switching point.

Furthermore, the instantaneous signal profile of the input signal can be determined, at least the upper and lower signal peaks in the signal profile can be determined, and the mean value can be calculated from these signal peaks. The discrepancy between the mean value and a predetermined reference value can be calculated, and the discrepancy can be compared with zero. If the discrepancy is greater than zero, a specific constant value can be subtractively linked to the input signal and, if the discrepancy is less than zero, can be additively linked to the input signal. Therefore, the switching point is varied only in fixed steps.

Alternatively, the instantaneous signal profile of the input signal can be determined, at least one lower and upper signal peak can be determined in the signal profile, and the mean value can be calculated from these signal peaks. The discrepancy between the mean value and a predetermined reference value can be calculated. The discrepancy can be compared with zero and the discrepancy can be allocated on the basis of its magnitude to one of three ranges for large, medium and small discrepancies and, depending on the range to which the discrepancy has been allocated, either the discrepancy, a constant value or nothing can be subtractively linked.

Furthermore, the respective instantaneous signal profile of the input signal can be determined continuously. At least one lower and upper signal peak in the respective signal profile can be determined. The mean value can be calculated from these signal peaks. The discrepancy between the mean value and a predetermined reference value can be calculated, and the discrepancy can be compared with zero. The discrepancy is further compared with a high and a low threshold value and, if the low threshold value is undershot, the input signal can remain unchanged. If the low threshold value is exceeded, a constant value can be continuously additively linked to the input signal if the discrepancy is less than zero, or can be subtractively linked if the discrepancy is greater than zero and, if the high threshold value is exceeded, the discrepancy can be continuously subtractively linked to the input signal until the low threshold value is undershot once again.

Furthermore, the output signal from the decision maker can be monitored for signal changes, and renewed determination of the DC element can be initiated if there is no signal change within a specific time. This makes it possible to avoid a slowly changing DC element not being identified.

Furthermore, in order to improve the interference immunity, the output of the decision maker can be switched off during the setting process. It is furthermore possible to provide for relative extremes in the signal profile to be assumed to be peak values only when the signal profile changes by a specific value at the extremes. This prevents, for example, relatively small relative extremes caused by interference being identified as signal peaks.

Furthermore, it is possible for first signal peaks not to be evaluated and only the subsequent signal peak or peaks to be used for evaluation. This measure likewise improves the interference immunity.

In order to achieve better resolution, in particular in conjunction with low-resolution analog/digital converters, the signal profile can be amplified before the signal peaks are determined, in such a manner that the gain is initially high and, if overdriving occurs, the gain is reduced until overdriving no longer occurs.

It is furthermore possible to provide for the signal amplitude to be determined and to be compared with an amplitude threshold value and, if the gain is relatively high, for the signal to be amplified when the signal amplitude falls below a specific value.

Finally, in one development of the invention, the mean value formed from the signal peaks can be a "weighted mean" which is calculated using the formula $$M = \frac{x \times A + y \times B}{x + y},$$

with A being the signal maximum, B being the signal minimum and x, y being element factors. If, for example, x=y=1, then this is an arithmetic mean. In this case, the maximum value has the same influence as the minimum value on the correction value. Correction using a weighted mean is particularly worthwhile for encoder wheels whose output signal has an asymmetric profile (input to the decision maker).

Other features which are considered as characteristic for the invention are set forth in the appended claims.

Although the invention is illustrated and described herein as embodied in a circuit configuration and a method for setting the switching points of a decision maker, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
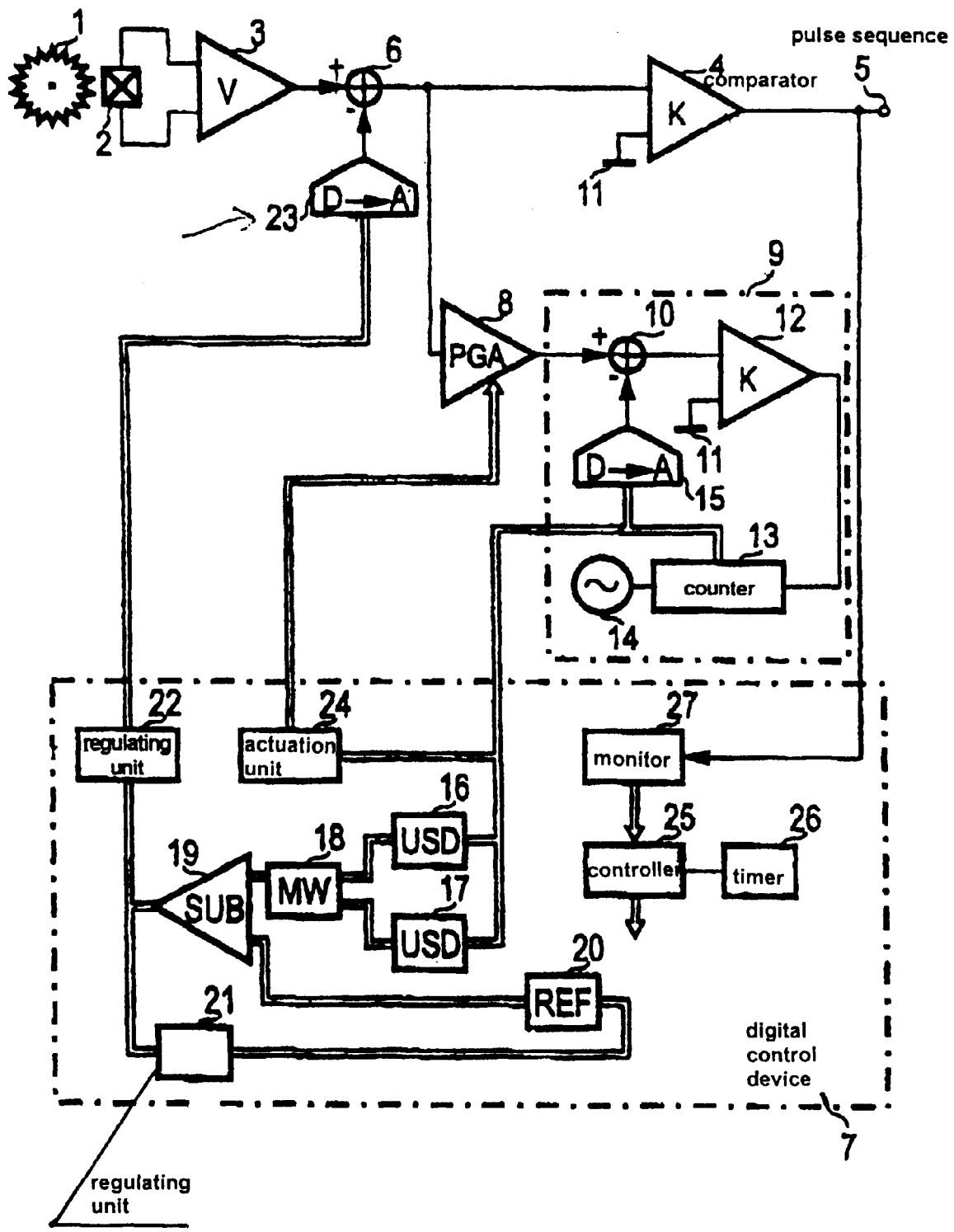
FIG. 1 is a block, circuit diagram of one embodiment of a circuit configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a circuit configuration according to the invention. In the circuit configuration, a rotational speed of a gearwheel 1 is detected by a Hall sensor 2, amplified by an amplifier 3, and is then converted with the aid of a comparator 4 into a pulse sequence whose frequency corresponds to the rotation speed of the gearwheel 1. The pulse sequence can be tapped off at an output 5 that is connected to an output of the comparator 4. By way of example, magnetic DC fields acting on the sensor 2 and/or offset voltages in the amplifier 3 can lead to an alternating signal, caused by the movement of the gearwheel 1 in the Hall sensor 2, being superimposed on a DC signal. This leads to the switching points of the comparator 4 being shifted, and thus to the pulse sequence of the output 5 having a different duty ratio. However, this corrupts the relationship between the pulse sequence at the output 5 and the movement of the gearwheel 1.

In order to avoid this, the DC element is now intended to be eliminated according to the invention, in such a manner that a correction signal that is determined in a particular manner is subtractively linked in the comparator 4, which acts as a decision maker 4, to the output signal of the amplifier 3. This may be achieved, for example, by appropriately changing the switching threshold of the comparator 4 or else—as is shown in the exemplary embodiment in FIG. 1—by subtraction of a correction signal from the output signal of the amplifier 3 by a subtractor 6 connected between the amplifier 3 and the comparator 4.

The correction signal is produced by a digital control device 7, to which the output signal from the subtractor 6 is supplied with the interposition of a digitally controlled analog amplifier 8 and an analog/digital converter circuit 9.

The analog/digital converter circuit 9 in the exemplary embodiment operates on the tracking principle. For this purpose, it has a subtractor 10, one of whose inputs is connected to the output of the amplifier 8. An output of the subtractor 10 is coupled to one input of a comparator 12, whose other input is connected to a reference-ground potential 11. The output of the comparator 12 is connected to a control input of a counter 13, thus controlling the counting direction of the counter 13. The counter 13 is also connected to a clock source 14. The count result can be tapped off at one output of the counter 13 and is supplied as a binary word to a digital/analog converter 15, which uses it to produce a corresponding analog signal. The analog signal is passed to the subtractor 10, where it is subtracted from the output signal from the controllable amplifier 8. In particular, the subtractor 10, the comparator 12, the counter 13, the clock generator 14 and the digital/analog converter 15 form the analog/digital converter circuit 9 which operates on the tracking principle. Therefore, the binary word at the output of the counter 13 always follows the output signal from the amplifier 8 in which, depending on whether the analog signal produced by the digital/analog converter 15 from the binary word at the output of the counter 13 is greater than or less than the signal at the output of the amplifier 8, the comparator 12 changes the counting direction of the counter 13, and thus readjusts the binary word to the signal at the output of the amplifier 8.

The binary word at the output of the counter 13 is also supplied to two peak-value detectors 16 and 17, one of the detectors 16 determines the relative minima, and the other 17 determines the relative maxima. The lower and upper signal peaks determined via the relative minima and maxima are passed to a computation unit 18 for calculation of the mid-value, which computation unit 18 uses them, for example, to determine the zero position in the input signal, by mean-value formation. The zero position is compared with a reference value by a subtractor 19, which is connected downstream from the computation unit 18. The reference value is provided by a reference unit 20, which is likewise connected to the subtractor 19. The reference value is in this case varied as a function of this by a reference control or regulating unit 21, which is connected upstream of the reference unit 20 and downstream of the subtractor 19, in such a way that the reference value is changed when the magnitude of the value of the mean value from the computation unit is outside a specific, predetermined range. Optionally, the computation unit 18 can have or be connected to a device 18' for scaling the mean value. The device 18' for scaling the mean value can also be connected to the output of the subtractor 19 rather than the output of the computation unit 18.

The output of the subtractor 19 is also passed to a regulating unit 22 which, depending on the output signal from the subtractor 19, produces an actuation signal for the digital/analog converter 23 connected downstream from it. The regulating unit 22 in this case produces a digital correction value, which the digital/analog converter 23 converts to an analog correction signal. The subtractor 6 then subtracts this from the output signal from the amplifier 3.

The control device 7 also contains an actuation unit 24, whose output side is connected to the control input of the controllable amplifier 8, and whose input side is connected to the output of the counter 13. The actuation unit 24 may, for example, contain a shift register, whose contents are formed by the binary word at the output of the counter 13, and are controlled by it, so that, overall, this results in the binary word at the output of the counter 13 being converted to logarithmic form.

All the functions of the control device 7 are controlled by a sequence controller 25. The sequence controller 25 is also connected to a timer 26 and to a monitoring device 27. The input side of the monitoring device 27 is connected to the output of the comparator 4, in order to monitor the output 5 to determine whether any signal change has taken place within a specific time period governed by the timer 26. If no change is found within this time period, then the DC element in the output signal from the amplifier 3 is measured once again.

In summary, the control device 7 and the analog/digital converter circuit 9 function as a calibrating device.

Figure 2:
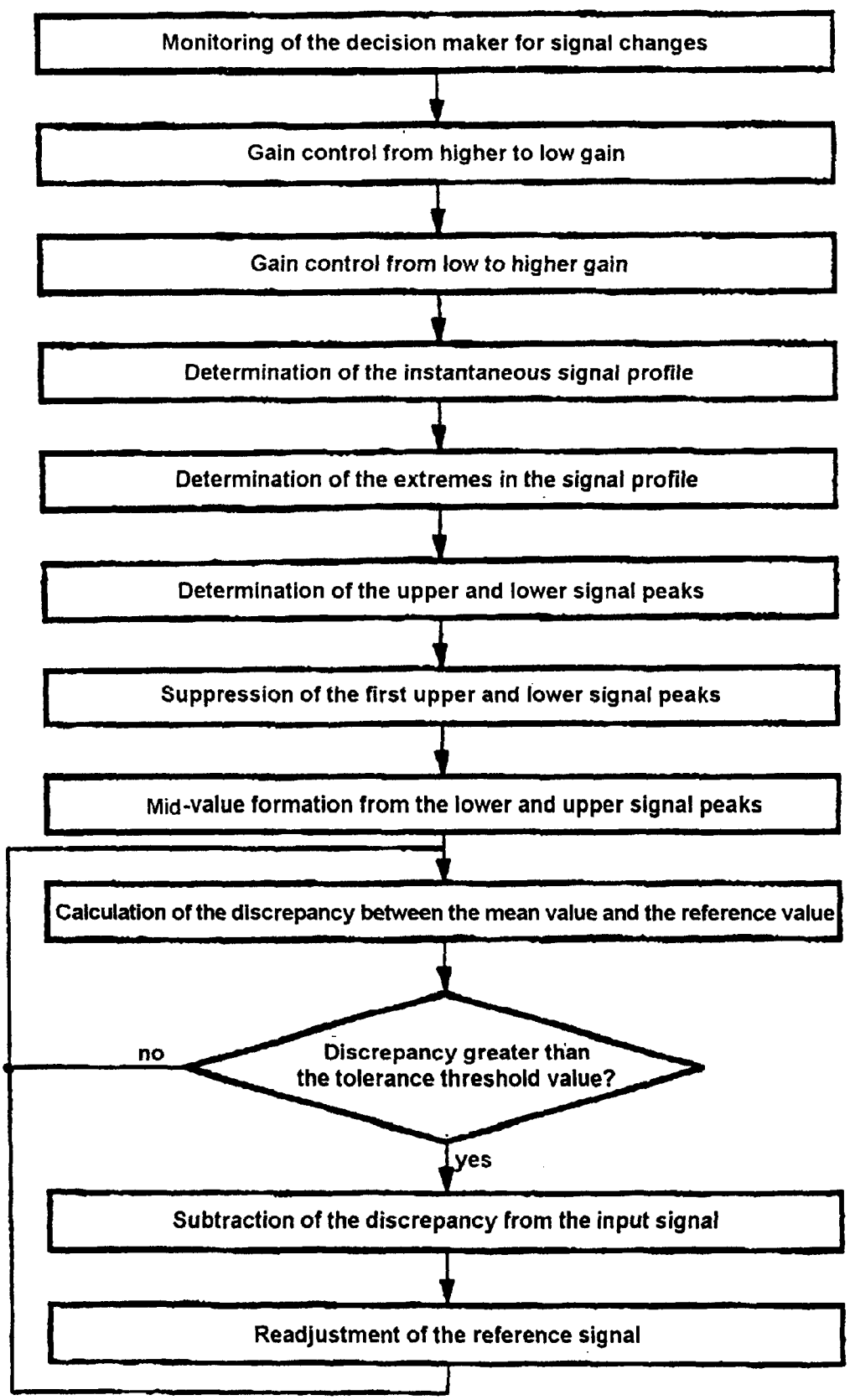
FIG. 2 is a signal flowchart for a first embodiment of a method according to the invention.

In the exemplary embodiment of a method according to the invention illustrated in FIG. 2, the gain of, for example, a measurement signal to be evaluated is initially controlled in the amplifier. This starts from the highest gain and, if overdriving occurs, is reduced until overdriving no longer occurs. Furthermore, it is possible to use the gain control to raise the gain if the measurement signal falls below a specific value. The correspondingly amplified measurement signal is then used to determine the instantaneous signal profile over a specific time window, and the relative extremes are then detected from this signal profile. The upper and lower signal peaks are then determined from the relative extremes, for example by ignoring the first relative extremes and using only the second and subsequent extremes for the evaluation. Furthermore, the only relative extremes which are considered are those which differ significantly from the adjacent values. Such an evaluation can be determined, for example, by evaluating the edge gradient or the amplitude difference within a specific time window. After determining the upper and lower signal peaks, the first upper and the first lower signal peak are suppressed in order to improve the interference immunity. The mid-value, that is to say the value precisely in the center between the upper and lower peaks, is then determined. The mid-value can in this case also be formed, for example, by forming the arithmetic mean value, by adding the amplitudes of the lower and upper signal peaks and dividing the total resulting from this by 2. After this, the discrepancy between the mean value and a predetermined reference value is determined, for example by subtraction. If the discrepancy is greater than a tolerance threshold value, the discrepancy is then subtracted from the input signal. Furthermore, as shown in FIG. 2, the reference signal can also be readjusted, with this process being made dependent, for example, on whether the discrepancy is outside a specific, predetermined range. If the discrepancy is not greater than the tolerance threshold value, then the reference signal is not readjusted nor is the discrepancy subtracted from the input signal.

It can now be provided for the steps described above to be carried out continuously, or to be carried out at specific times. Furthermore, it is possible to provide for the output of the decision maker to be monitored for signal changes. This avoids, for example, the discrepancy incorrectly being so large that the input signal assumes extreme values despite subtraction of the discrepancy. The decision maker would in consequence be "clamped" in this direction, and the output signal from the decision maker would no longer change, despite a changing measurement signal.

Figure 3:
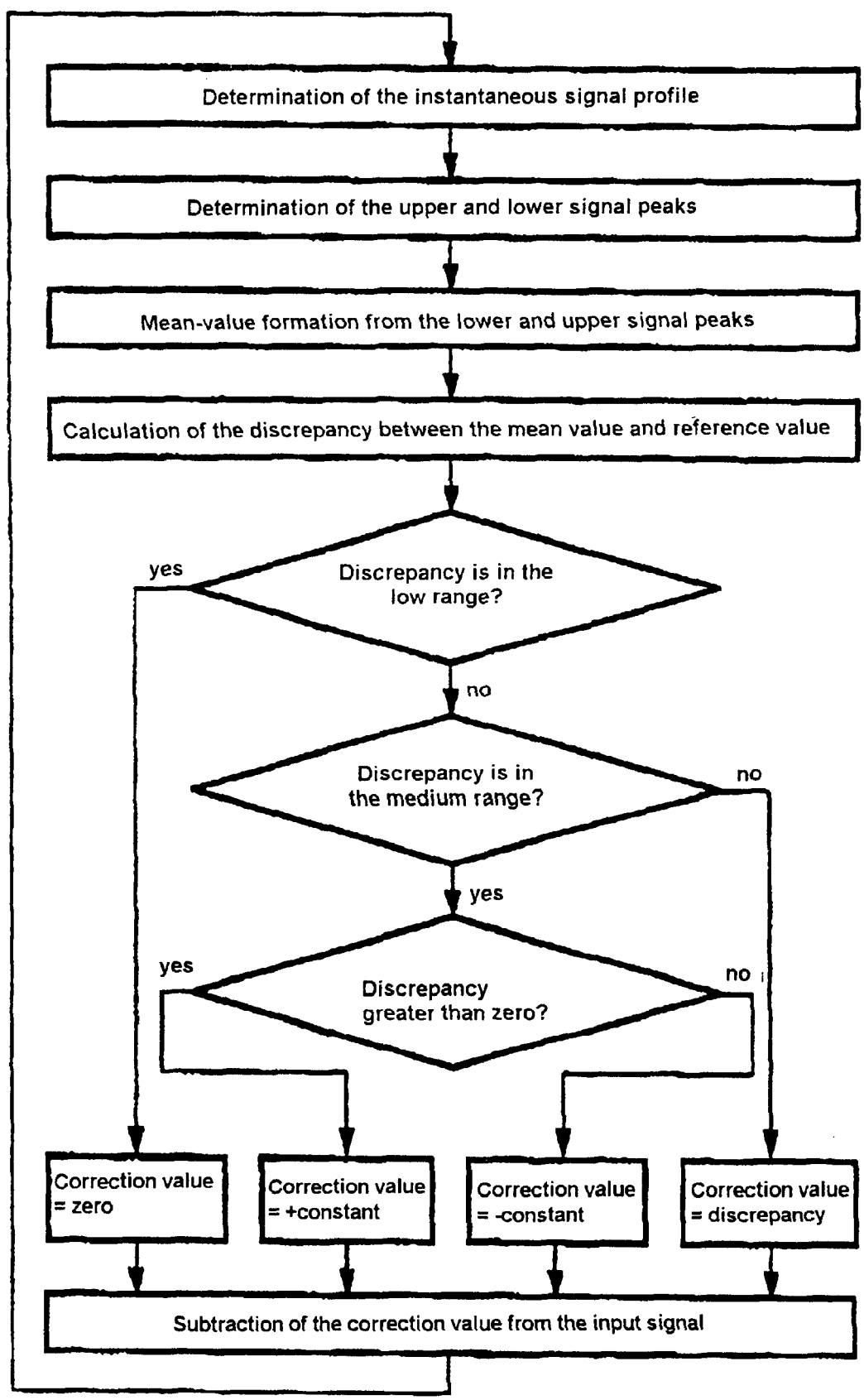
FIG. 3 is a flowchart for a second embodiment of a method according to the invention.

In the method illustrated schematically in FIG. 3, the instantaneous signal profile is determined. The upper and lower signal peaks are then determined from this and, finally, the mid-value is calculated from the lower and upper signal peaks. After this, the mid-value is subtracted from the reference value to determine the discrepancy between the mid-value and the reference value. The discrepancy is then allocated to one of three ranges. One range in this case covers small discrepancies, a second range covers medium discrepancies, and the third range, finally, covers relatively large discrepancies. A check is thus carried out to determine whether the discrepancy is in the first range with small discrepancies. If this is the case, then a correction value is set to be equal to zero. If the discrepancy is not in this range, then a check is carried out to determine whether it is in the range with medium discrepancies. If this is also not the case, then the correction value is set to be equal to the discrepancy. If, on the other hand, it is found that the discrepancy is in the range with a medium discrepancy, then a check is carried out to determine whether the discrepancy is positive, that is to say whether the discrepancy is greater than zero. If it is greater than zero, then the correction value is set to be equal to a positive constant, and if the discrepancy is less than or equal to zero, then the correction value is set to be equal to a negative constant. The correction value set in this way is then, finally, subtracted from the input signal. The individual steps can in this case be carried out continuously or else individually and successively, with the process of determining the instantaneous signal profile starting once again in the latter case once the correction value has been subtracted from the input signal.

Figure 4:
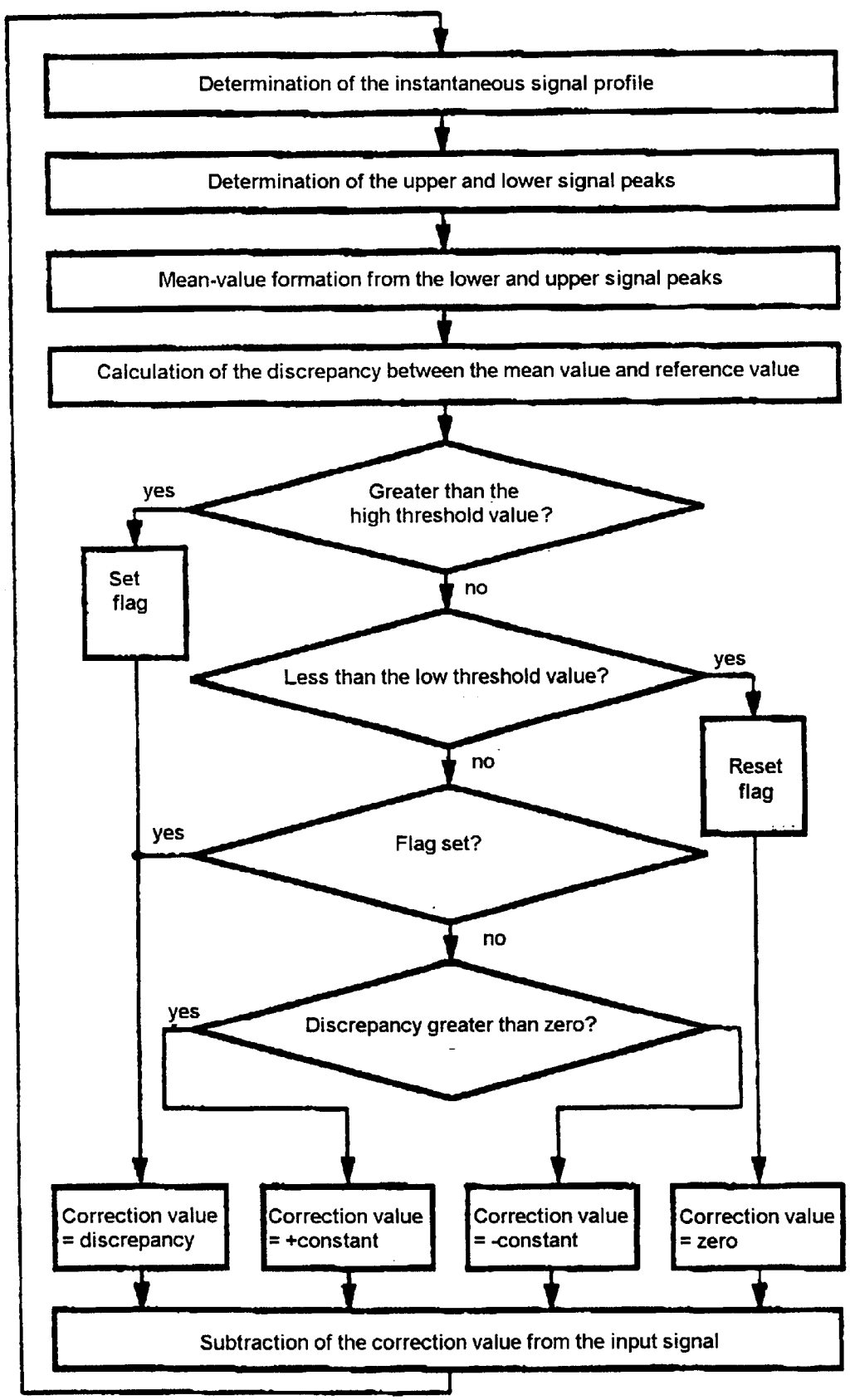
FIG. 4 is a flowchart for a third embodiment of a method according to the invention.

In the method according to the invention as illustrated schematically in FIG. 4, the instantaneous signal profile is once again determined initially, the upper and lower signal peaks are then determined, the mid-value is calculated from the lower and upper signal peaks, and the mid-value is then subtracted from the reference value in order to calculate the discrepancy between the mid-value and the reference value. After this, a check is carried out to determine whether the discrepancy is greater than the threshold value. If this is the case, then a flag is set and a correction value is made equal to the discrepancy. If, on the other hand, the discrepancy is less than or equal to the threshold value, then the next step is to check whether the discrepancy is less than a low threshold value. If this is the case, then any flag that may have been set is reset, and the correction value is set to be equal to zero. If the discrepancy is not less than the lower threshold value, then a check is carried out to determine whether the flag is or is not set. If the flag is set, then the correction value is set to be equal to the discrepancy. If the flag is not set, then a check is carried out to determine whether the discrepancy is positive or negative. This is done by a question asking whether the discrepancy is greater than zero. If this is true, then the correction value is set to be equal to a positive constant. If this is not true, then the correction value is set to be equal to a negative constant. The positive and negative constants may in this case have the same magnitude or, in certain cases, may also differ. Finally, the respectively set correction value is then subtracted from the input signal. The individual steps are in this case once again carried out either continuously or else individually in sequence, with the processing being started once again after a specific time, or immediately.

A major aspect of the present invention is that the signal path between the measurement sensor and the switching output is kept as simple as possible. A controllable amplifier is preferably provided in a parallel path, and its output is passed to a comparator input for comparison with the output signal from an output (which is connected to the other comparator input) of a digital/analog converter. The digital/analog converter is controlled by logic in a control circuit such that the resultant difference signal remains in the vicinity of the comparator switching point. This results in the formation of a so-called tracking analog/digital converter. However, any other desired analog/digital converter may also be used. However, the tracking analog/digital converter has the advantage that it has high accuracy with little circuitry complexity, in particular as a result of the fact that there is no need for any filters and/or sample-and-hold elements. If it is assumed that the controllable amplifier has a fixed gain, then this results in an analog/digital converter with a linear transmission curve. Taking account of the fact that the controllable amplifier has a variable gain, this results in an analog/digital converter with a logarithmic response. For the rest of the description, it is assumed that the controllable amplifier can be controlled by binary words and that the individual gain factors are in binary steps (1, 2, 4, 8, 16, . . . ). Although this is not essential, it is highly advantageous for the rest of the calculations and for the implementation, since gain changes by a factor of 2 can easily be reproduced and provided by shifting the binary decimal point. Furthermore, the controllable amplifier is configured such that the minimum input signal of interest can still be observed sufficiently accurately at the maximum gain. Conversely, the maximum input signal (when the gain is then at a minimum) must also not result in the subsequent circuit parts being overdriven.

The digital/analog converter that is connected downstream from the controllable amplifier is in this case intended for digitization of the signal to be evaluated. For example, a digital/analog converter which can process six bits in parallel thus results in 64 equidistant values. If the gain is increased, then this once again results in 64 equidistant values, but now in a smaller range with respect to the input signal. Overall, this leads to a response in which the binary codes are very close together when the signals are very small (=high gain), while the code intervals are greater for larger signals (=low gain). With regard to the respective signal amplitude, the resolution is thus always approximately the same, once the gain has been matched. In this case, it is assumed that the signal has already had the DC elements removed from it to some extent. In consequence, even small signals can be monitored sufficiently accurately using converters whose resolution is relatively low. This is highly advantageous since the construction of converters with low resolution is much simpler and more cost-effective and, furthermore, the conversion time is considerably shorter.

The following text assumes that the signal produced by the sensor is an AC signal with some DC element. In this case, the DC element may also be significantly greater than the amplitude of the AC signal itself. The signal supplied from the sensor is digitized sufficiently accurately by the analog/digital converter described above, in conjunction with the controllable amplifier. In this case, it is also assumed that the ratio between the digital/analog converter which is connected upstream of the control device and the digital/analog converter which is connected downstream from the control device is known, so that the codes can be converted, at least approximately, to one another. The fundamental steps described in the following text are then carried out in sequence:

a) If necessary, the system output (for example the output of the comparator 4 in FIG. 1) is switched off, after which the instantaneous signal value is looked for. This is done by switching the digital/analog converter connected downstream from the control device 7, and the comparator 4 (or the digital/analog converter connected downstream from the control device 7 and the comparator connected upstream of the control device 7 if the initial value of the analog/digital converter connected upstream of the control device is zero and, expediently, if the gain of the controllable amplifier is high), as an analog/digital converter. This can be done as in the case of a tracking analog/digital converter or else, to save time, in the form of an analog/digital converter with successive approximation. At the end of the conversion process, the value that corresponds to the instantaneous signal value is stored in the digital/analog converter connected downstream from the control device. This value is regarded as the first DC element of the signal. This ensures that the controllable amplifier can be set to a sufficiently high gain irrespective of the actual DC element, and that the signal can thus be digitized well.

b) After this, the digital signal values detected in this way are analyzed and investigated for minima and maxima. In the process, extreme values are accepted as such only provided they are sufficiently strongly pronounced, that is to say a maximum is accepted as such only when the signal becomes considerably smaller once again after it. A corresponding situation applies to minima. This condition avoids a signal being simulated by noise or other system disturbances. In this case, the first extreme is suppressed, since it is normally not a real extreme but is only the start of the curve when observation commences. The method starts with the maximum gain, to ensure that small signals are not overlooked. If the digital/analog converter which is connected upstream of the control device reaches its limit, the gain is reduced in steps until no more overflows occur. Any extremes that may have already been found are deleted. This process of switching up the range with simultaneous deletion of the extremes is preferably carried out automatically in all the subsequent method steps, if necessary. If at least one minimum and at least one maximum has now been found, the process moves on to the next method step c).

c) The minima and maxima that have been found are regarded as lower and upper signal peaks, and their mid-value is calculated. The discrepancy between the mid-value and a reference value that represents the desired switching point is then determined. The output word for the digital/analog converter, which is connected downstream from the control device, is corrected by the magnitude of the discrepancy. The output of the comparator 4 is now enabled. Ideally, the digital/analog converter that is connected downstream from the control device is now set exactly, and the entire system is thus calibrated after only one oscillation. However, in fact, it must be expected that the non-ideal circuit technology will result in the offset not being achieved exactly. Thus, at least one further pair of minima and maxima is determined within the next period. If the correction value resulting from this is in the direction such that it cannot be the cause for one flank of the comparator 4, step c) is now repeated, or else the process waits for the next flank. Whenever switching disturbances are suspected, the associated comparator is briefly "disabled", in order to avoid uncontrolled results. If it is found in the process of determining minima and maxima that the signal amplitude falls below a specific threshold value, the controllable amplifier can also be switched to a more sensitive range at the next change in the correction value. The switching criterion is in this case expediently chosen such that there is still a certain safety margin from the range overflow point in the more sensitive range.

Continual repetition of step c) allows any changes in the DC element to be determined and compensated for. In this case, it must be remembered that any change in the DC element in step c) at the same time results in a sudden change in the switching threshold. The following method steps can thus also be used for systems which react sensitively to repeated sudden changes.

d) If the DC element falls below a specific, acceptable value, then step c) is disabled. Correction for the DC element is started once again only when the DC element rises above an upper limit.

e) The DC element can also be corrected on a minimal level. The DC element is then corrected (being incremented or decremented) only by the binary value 1 rather than by the calculated value.

f) Alternatively, steps c), d) and e) can be combined in such a manner that either step c) (large DC element), step e) (medium DC element) or nothing (low DC element) is carried out, depending on the magnitude of the DC element.

g) Alternatively, steps c), d) and e) can also be combined in such a manner that the corrections are disabled once a minimum DC element has been undershot, step e) is carried out if a specific threshold is exceeded, and step c) is carried out if a further threshold is exceeded, until the disabling threshold is reached once again.

Furthermore, in addition and if required, it is possible in systems with a low cut-off frequency to start with step a) once again if no measurement signal is identified within a specific predetermined time (the output signal from the comparator 4 does not change). In some circumstances, there is no need to reset the controllable amplifier once again in this case. The purpose of this procedure is that, in the event of major incorrect system control actions, the circuit nevertheless starts up again on its own. Such major system disturbances may result, for example, if severe DC element drift occurs at a time when there is no wanted signal, so that, in consequence, a returning wanted signal also no longer produces any output flanks. Thus, overall, this measure improves the operational reliability.

I claim:

1. A circuit configuration for correcting an analog input signal having a DC element, an AC element, and upper and lower signal peaks whose ratio to one another is selectively fixed, the analog input signal being corrected by compensation for the DC element, the circuit configuration comprising:

a decision maker receiving the input signal;
a calibration device, including:
an analog/digital converter actuated by the input signal and connected to said decision maker;
peak-value detectors for determining the upper and lower signal peaks of the input signal, said peak-value detectors disposed downstream from said analog/digital converter;
a controllable reference unit providing a reference value;
a computation unit for determining a mean value from at least one signal minimum and at least one signal maximum and disposed downstream from said peak-value detectors, the mean value being one of an arithmetic mean of the upper and lower signal peaks and mean weighted using the selectively fixed ratio;
a comparison unit for determining a signal position of the input signal by comparing the reference value with the mean value determined by said computation unit, said comparison unit connected to said computation unit and said controllable reference unit;
a first regulating unit having an input connected to said comparison unit and an output linked to said decision maker, said first regulating unit compensating for the DC element in the input signal if an unbalanced signal position is detected by said comparison unit, with the compensation being carried out by subtraction of a value which is determined from an output of said comparison unit from the input signal;
a second regulating unit having an input connected to said comparison unit and an output connected to said controllable reference unit, said second regulating unit readjusting the reference value in an opposite sense to an output signal from said comparison unit, in which case a difference between the mean value and the reference value is used to form a new reference value; and
means for scaling the mean value disposed between said computation unit and one of said comparison unit and an output side of said comparison unit.

2. The circuit configuration according to claim 1, wherein said second regulating unit readjusts the reference value if, and only if, a magnitude of a value of the mean value in said computation unit is outside a specific predetermined range.

3. The circuit configuration according to claim 1, including an analog controllable amplifier receiving the input signal and connected upstream of said calibration device, said calibration device having a control input and said analog/digital converter having an output, said analog controllable amplifier having a control input connected to said control output of said calibration device in order to control a gain of said analog controllable amplifier in dependence on an instantaneous value at said output of said analog/digital converter.

4. The circuit configuration according to claim 3, wherein a gain of said analog controllable amplifier can be controlled by binary words.

5. The circuit configuration according to claim 1,
wherein said calibration device has means for digital signal processing; and
including a digital/analog converter connected downstream to said calibration device.

6. The circuit configuration according to claim 1, wherein the input signal has a cut-off frequency, said decision maker has an output connected to said calibration device, and said calibration device has a monitoring device connected to said decision maker and a timer, said calibration device monitoring said output of said decision maker for signal changes and, if there is no signal change within a time governed by said timer, initiating determination of the DC element.

7. A method for correcting an analog input signal received by an input of a decision maker, by compensation for a DC element which is contained in addition to an AC element in the input signal, with the input signal having upper and lower signal peaks whose ratio to one another is fixed but variable, which comprises the steps of:
determining an instantaneous signal profile of the input signal by digitization;
determining a signal minima and a signal maxima of the instantaneous signal profile;
calculating a mean value from the signal minima and the signal maxima, the mean value being one of an arithmetic mean of the upper and lower signal peaks and a mean which is weighted using the fixed but variable ratio;
calculating a discrepancy between the mean value and a predetermined reference value reflecting the DC element of the input signal;
subtracting the discrepancy from the input signal by a first regulating unit; and
readjusting the predetermined reference value in an opposite sense to an output signal from a comparison unit by a second regulating unit.

8. The method according to claim 7, which comprises:
continuously determining the instantaneous signal profile of the input signal;
continuously determining the signal minima and the signal maxima in the instantaneous signal profile;
continuously calculating the mean value from the signal minima and the signal maxima, the mean value being one of the arithmetic mean of the upper and lower signal peaks and the mean which is weighted using the fixed but variable ratio;
continuously calculating a discrepancy between the mean value and a predetermined nominal value; and
subtracting the discrepancy from the input signal.

9. The method according to claim 7, which comprises:
continuously determining the instantaneous signal profile of the input signal;
continuously determining the signal minima and the signal maxima in the instantaneous signal profile;
continuously calculating the mean value from the signal minima and the signal maxima, the mean value being one of the arithmetic mean of the upper and lower signal peaks and the mean which is weighted using the fixed but variable ratio;
continuously calculating a discrepancy between the mean value and a predetermined nominal value;
continuously comparing the discrepancy with a tolerance threshold value; and
subtracting the discrepancy from the input signal if a magnitude of the discrepancy exceeds the tolerance threshold value.

10. The method according to claim 7, which comprises:
continuously determining the instantaneous signal profile of the input signal;
continuously determining the signal minima and the signal maxima in the instantaneous signal profile;
continuously calculating the mean value from the signal minima and the signal maxima, the mean value being one of the arithmetic mean of the upper and lower signal peaks and the mean which is weighted using the selectively fixed ratio;
continuously calculating a discrepancy between the mean value and a predetermined nominal value;
continuously comparing the discrepancy with zero; and
subtracting a specific constant value from the input signal if the discrepancy is greater than zero, and is added to the input signal if the discrepancy is less than zero.

11. The method according to claim 7, which comprises:
continuously determining the instantaneous signal profile of the input signal;
determining the signal minima and the signal maxima in the instantaneous signal profile;
continuously calculating the mean value from the signal minima and the signal maxima, the mean value being one of the arithmetic mean of the upper and lower signal peaks and the mean which is weighted using the selectively fixed ratio;
continuously calculating a discrepancy between the mean value and a predetermined nominal value;
continuously comparing the discrepancy with zero; and
continuously allocating the discrepancy, according to its magnitude, to one of three ranges for large, medium and small discrepancies, and depending on a range to which the discrepancy has been allocated, one of the discrepancy, a constant value and nothing is subtracted from the input signal.

12. The method according to claim 7, which comprises:
continuously determining the instantaneous signal profile of the input signal;
continuously determining the signal minima and the signal maxima in the instantaneous signal profile;
continuously calculating the mean value from the signal minima and the signal maxima, the mean value being one of the arithmetic mean of the upper and lower signal peaks and the mean which is weighted using the selectively fixed ratio;
continuously calculating a discrepancy between the mean value and a predetermined nominal value;
continuously comparing the discrepancy with zero; and
continuously comparing the discrepancy with a high and a low threshold value, if the low threshold value is undershot, the input signal remains unchanged, if the low threshold value is exceeded, a constant value is continuously added to the input signal if the discrepancy is less than zero, or is subtracted from it if the discrepancy is greater than zero, and if the high threshold value is exceeded, the discrepancy is continuously subtracted from the input signal until the low threshold value is undershot once again.

13. The method according to claim 7, wherein the input signal has a lower cut-off frequency, an output signal from the decision maker is monitored for signal changes, and if there is no signal change within a specific time, determination of the DC element is initiated once again.

14. The method according to claim 7, which comprises switching off an output of the decision maker during the calibration process.

15. The method according to claim 7, wherein relative extremes in the instantaneous signal profile are assumed to be peak values only when the instantaneous signal profile changes by a specific value at the extremes.

16. The method according to claim 7, wherein a first signal peak of the instantaneous signal profile is not evaluated, and only a subsequent signal peak is used for evaluation.

17. The method according to claim 7, which comprises amplifying the instantaneous signal profile before determining the signal maxima and the signal minima, in such a way that a high gain is provided initially and, if overdriving occurs, the gain is reduced until overdriving no longer occurs.

18. The method according to claim 7, which comprises determining a signal amplitude and comparing the signal amplitude with an amplitude threshold value, and in which, when a gain is relatively high, the signal is amplified when the signal amplitude falls below a specific value.

19. The method according to claim 7, wherein the mean value is obtained from the signal minima and the signal maxima by forming a weighted mean value using the formula:

$$M = \frac{x*A + y*B}{x+y}$$

where A is the signal maxima, B is the signal minima and x, y are weighting factors.

* * * * *